US010177709B2

(12) United States Patent
Fent (10) Patent No.: US 10,177,709 B2
(45) Date of Patent: Jan. 8, 2019

(54) HYBRID SOLAR COLLECTOR AND OPERATING PROCEDURE (71) Applicant: Nelson Architech GmbH, Cham (CH)

(72) Inventor: Giuseppe Fent, Hosenruck (CH)

(73) Assignee: Nelson Architech GmbH, Cham (CH)

(*) Notice: Subject to any disclaimer, the term of this patent is extended or adjusted under 35 U.S.C. 154(b) by 35 days.

(21) Appl. No.: 15/245,069

(22) Filed: Aug. 23, 2016

(65) Prior Publication Data

US 2017/0063302 A1 Mar. 2, 2017

(30) Foreign Application Priority Data

Aug. 25, 2015 (EP) .................... 15405053

(51) Int. Cl.
*H02S 40/44* (2014.01)
*H02S 40/42* (2014.01)
(Continued)

(52) U.S. Cl.
CPC .............. *H02S 40/44* (2014.12); *F24S 20/25* (2018.05); *F24S 20/66* (2018.05);
(Continued)

(58) Field of Classification Search
CPC . F24J 2/0015; F24J 2/0444; F24J 2/34; H01L 31/0684
See application file for complete search history.

(56) References Cited

U.S. PATENT DOCUMENTS 6,581,589 B1 6/2003 Fent
9,344,032 B2 5/2016 Duong
(Continued)

FOREIGN PATENT DOCUMENTS

DE 19914079 A1 9/2000
FR 2978298 A1 1/2013
(Continued)

OTHER PUBLICATIONS

European Patent Office Search Report for EP 15405053 (dated Feb. 8, 2016).
Schweizer Solarpreis 2012, "186%-Plusenergiebau-MFH Fent, 9500 WIL/SG" pp. 50-51.

*Primary Examiner* — Matthew T Martin
(74) *Attorney, Agent, or Firm* — Wuersch & Gering LLP; Maria Luisa Palmese (57) ABSTRACT The invention relates to a hybrid solar collector that generates thermal and electrical energy while maintaining a comfortable indoor climate. The hybrid solar collector comprises a thermal energy collector for time-delayed transfer of thermal energy resulting from incident solar energy into building walls having a rear-vented cover arranged so that an air gap is formed between the solid collector portion and the cover, said cover comprising photovoltaic (PV) elements and being at least partially transparent and/or partially translucent so as to allow solar radiation to impinge on the solid thermal collector, wherein the air in the gap between the cover and the collector is sucked by a heat pump preferably for use in heating water or thermal storage The hybrid solar collector of the invention stores thermal energy in and releases thermal energy from the thermal collector portion, while also generating electricity using the PV elements and utilizing thermal energy from the heated air in the air gap. Operating procedures include targeted air flow and heat recuperation. The system may be used to retrofit existing thermal solar cells with incident-angle-selective structure.

28 Claims, 6 Drawing Sheets (51) Int. Cl.
  *H01L 31/068*  (2012.01)
  *F24S 20/25*   (2018.01)
  *H02S 40/22*   (2014.01)
  *F24S 20/66*   (2018.01)
  *F24S 80/00*   (2018.01)

(52) U.S. Cl.
  CPC .......... *H01L 31/0684* (2013.01); *H02S 40/22* (2014.12); *F24S 2080/017* (2018.05); *Y02B 10/10* (2013.01); *Y02B 10/20* (2013.01); *Y02B 10/70* (2013.01); *Y02E 10/44* (2013.01); *Y02E 10/60* (2013.01)

(56) References Cited

U.S. PATENT DOCUMENTS

| | | | |
|---|---|---|---|
| 2008/0245402 A1* | 10/2008 | Romeo | F24D 11/0221 136/248 |
| 2009/0199892 A1* | 8/2009 | Farquhar | F24J 2/045 136/248 |
| 2011/0232724 A1 | 9/2011 | Duong | |
| 2016/0322526 A1 | 11/2016 | Kuhn et al. | |

FOREIGN PATENT DOCUMENTS

| WO | WO1999054669 A1 | 10/1999 |
|---|---|---|
| WO | WO2015091698 A1 | 6/2015 |

* cited by examiner

Fig. 7

HYBRID SOLAR COLLECTOR AND OPERATING PROCEDURE

FIELD OF THE INVENTION

The present invention relates to a novel hybrid solar collector and operating procedure for its use.

BACKGROUND INFORMATION

A solar cell having a solar collector and storage element is known in the art (WO 99/54669, Giuseppe Fent, the entirety of which is incorporated herein by reference) and has in its architectural implementation (Lucido®, trademark of Lucido Solar AG, 9500 Wil SG, Switzerland) won several awards. WO 99/54669 discloses a thermal solar collector with an incident-angle-selective structure and a transparent rear-vented cover, the collector being mounted onto an insulated building façade. The incident solar energy is time delayed ("stored") by four to twelve hours, depending on the heat capacity and thermal transmittance property of the cell's components, and then transferred to the building walls and into the interior of the room creating a comfortable climate with temperate wall surfaces and a corresponding energy gain.

In the field of sustainable buildings, however, there is a demand for maximum use of irradiated solar energy in the form of both thermal and electrical energy. Surplus electrical energy can be either fed back into the electrical grid and/or used to charge an electric vehicle. Such excess electrical energy may also be used to power an efficient brine-to-water heat pump by using stored thermal energy time-delayed in a conventional heating system (e.g., radiant floor heating) or to preheat (heat exchanger) the air of the ventilation system and/or for cooling (cooling ceilings).

In particular, there is a need for a hybrid solar collector that also allows for the retrofitting of existing façades in order to accommodate the growing demand of locally generated electrical energy especially as storage technologies (e.g. batteries) continue to improve.

Furthermore, such a hybrid collector should be aesthetically pleasing and, through structural flexibility, visually adaptable to local environmental conditions as well as the building's structure.

It is therefore a goal of this invention to develop a hybrid solar collector for façades and an operating procedure, which increases the total gain of usable energy without compromising the functioning of the thermal collector that helps regulate the indoor climate (comfort climate WO-A1-99/54669).

It is a further goal of this invention to develop a hybrid solar collector for façades that is able to adjust and compensate for existing diurnal climate fluctuations without a large technological expense, and reduce, and at times even completely eliminate, dependence on the electrical grid and its power feed

SUMMARY OF THE INVENTION

This goal is achieved through the invention described herein. The hybrid solar collector of the invention is preferably designed for installation onto house façades and comprises a heat storing solid thermal energy collector for a time-delayed thermal transfer into the building walls and a rear-vented cover, said cover comprising photovoltaic (PV) elements for the generation of electricity selected and/or arranged so as to allow solar radiation to reach the thermal collector. The heated air in the gap between the cover and the thermal collector is preferably collected and used, preferably for heating water, or thermal storage. The targeted air flow and heat recuperation are part of the process of operations.

The hybrid solar collector can be retrofitted unto known thermal solar collector cells with incident-angle-selective structure. With reference to the Figures, the hybrid solar collector (1) for the installation onto house façades uses the incident solar energy for a time-delayed thermal transfer into the building walls. The rear vented cover (2) contains PV elements (3', 3") for the generation of electricity which are either partially transparent and/or partially translucent and therefore at least some infrared radiation is transmitted, while the heated air (A) in the air gap (4) between the cover (2) and the collector (5), is sucked in by a heat pump (80), preferably, for use of hot water preparation or thermal storage. The targeted air flow and heat recuperation are part of a process of operations. The system is designed in such a way that it can be retrofitted onto other known thermal solar cells with incident-angle-selective structure.

Conventional, commercially available PV elements may be used, including those with increased efficiency. Such commercially available PV elements vary in degree of opacity and may be entirely or partially opaque, transparent or translucent. Depending on the type of PV element chosen, the cover is partially transparent (allows for radiation volume flow or transmittance) or simply translucent. In any case, the cover should be designed in such a way that infrared radiation can impinge on the solid thermal collector, in order to be transmitted with a time delay into the interior of the house. The PV elements are thus selected and/or arranged in a pattern such that solar radiation may pass through the cover to heat the collector and the air gap. The pattern could be selected to form an incidence-angle-selective surface. The incident-angle-dependent shading can at least in part be achieved through PV elements arranged in a horizontal stripe-like pattern with gaps in between the stripes. The solid thermal collector preferably includes an incidence-angle-selective surface, but could also be smooth where the cover provides an incidence-angle-selective effect through use of incident-angle-dependent shading. It is also advantageous to create at least one outlet for the hot air within the collector itself.

Bifacially active PV elements have been proven to be especially efficient and may be used to take advantage of energy reflected off of the solid thermal collector. The solid thermal collector may be designed and/or provided with appropriate coatings or reflective surfaces to take advantage of such bi-facially effective reflectors. The use of the reflected radiation off of the collector increases the gain of electrical energy in combination with multi-layered PV elements by up to 30% in comparison to regular PV elements.

PV elements can be configured according to the technology disclosed in WO-A1-2015/091698, which is incorporated by reference herein in its entirety. This allows for nearly unlimited design possibilities, thus allowing for an optimal visual adaption of the appearance of the façade into the surrounding area and/or to the perception of the beholder.

The solid thermal collector portion may be made at least partially of wood, ceramic or clay. While these materials are proven to be suitable, other suitable heat conducting materials, especially heat conducting composites, may also be used. If made of ceramic, the collector advantageously is provided with hollow spaces behind the surface as shown in FIGS. 3-6. Ceramic collectors with integrated hollow spaces make a good thermal insulation.

The operating procedure increases the energy gain and utilizes especially the solar radiation maxima to ensure its usage and storage throughout the daytime.

In contrast to the previously existing technology which releases air in the gap between the cover and collector at the roof edge into the open, the hybrid solar collector of this invention also exploits the hot air formed in the air gap between the cover and the collector for energy gain by using an exhaust mechanism that controls the air flow in the air gap so that the PV elements are cooled on the one hand and, on the other, unwanted heat intake into the building interior is prevented.

The operating procedures use conventional mechanical systems that increase the efficiency as well as regulate the temporal availability of the energy. For example, the operating procedure provides for leading exhaust air from the air exhaust gaps to an upper area of multiple collectors preferably arranged at equal height and through exhaust pipes into a collector duct where it is intermixed and subsequently lead to a centralized location for use and/or processing in the interior of the house. A variation of the operating procedure could also provide for fresh air to be added along the way, for example to the exhaust air gap or collector ducts. The operating procedure could further provide for measuring the temperature of the exhaust air and leading it via the collector duct into a variable heat pump, whereby a variable speed compressor controls the volume of the exhaust air in the air gap of the module in such a way that the temperature in the exhaust duct is set to a constant set point so that the heat pump can work at its optimal operating point.

The invention makes it possible to build so-called "plus energy houses" without the need for thermal or electrical solar panels on the roof and/or in the garden. It has been shown that in Central Europe a single southerly facing façade can produce enough energy to cover the standard energy demand of a house.

The drawings, which are briefly described below, illustrate simplified design examples according to the invention, which can be adjusted in accordance with the needs of the building and/or environment to optimize for the desired form of energy (thermal or electrical) and its desired use.

BRIEF DESCRIPTION OF THE DRAWINGS

FIG. 6 is a cross-sectional view of another embodiment of a hybrid solar collector according to the invention having a flat, glazed ceramic thermal collector in combination with PV elements arranged in a horizontal strip pattern with gaps in between.

DETAILED DESCRIPTION

The subject matter of the invention and its exemplary embodiments and methods are described in more detail below with reference to the schematic drawings described above. A key to the numerals and symbols in the drawings is included at the end of this section. It is to be understood, however, that the embodiments and methods discussed and/or illustrated herein are intended only as illustrative examples and that the present invention is not limited thereby.

Figure 1:
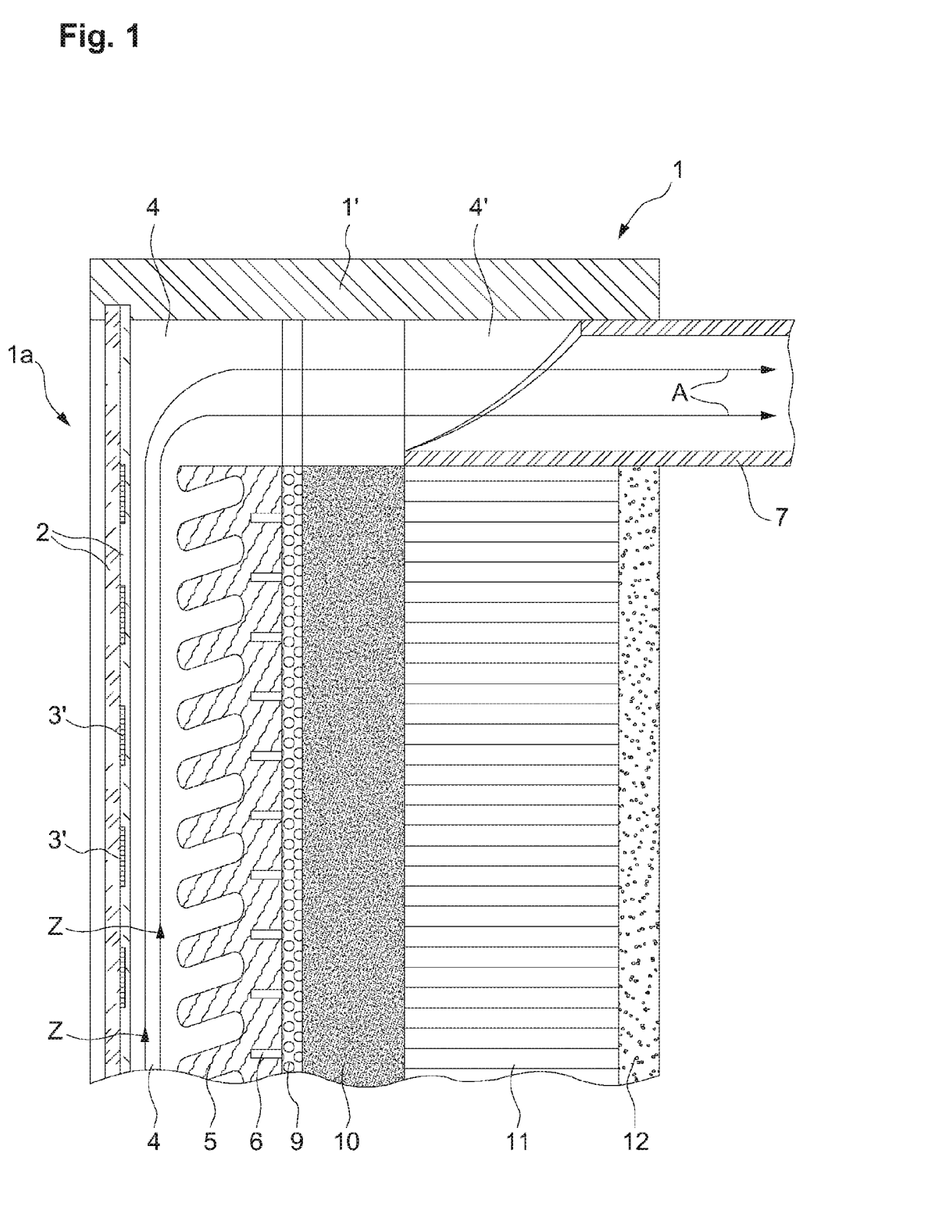
FIG. 1 is a cross-sectional view of the upper part of a module of a hybrid solar collector according to the invention with PV elements arranged in a stripe-like horizontal pattern with gaps in between the stripes, including a pipe that leads away the hot air from the air gap for direct and/or indirect usage.

With reference to FIG. 1, a hybrid solar collector module 1 to be exposed to solar radiation. On the front side, within the wooden module frame 1' is a multilayered glass cover 2 in which PV elements 3' are arranged in a stripe-like pattern horizontal pattern with gaps in between the stripes. The PV elements are coupled electrically in a typical manner to produce directly usable direct current (regulated battery charge) or feed electric power selectively into power supply units via inverters.

Through the multilayered cover 2 the infrared radiation strikes a solid wood collector 5 having incident-angle-selective collector noses, which, as described in WO 99/54669, generates hot air flow in the air gap 4. However, contrary to WO 99/54699, in this case the hot air generated is completely led away for further use through an air exhaust gap 4' and through at least one air outlet 7.

The back side of the collector 5 includes expansion joints 6 meant to accommodate for thermal expansion as well as to facilitate moisture transfer out of the wood. The module includes insulation adjacent to the back side of the collector 5. The adjacent insulation comprises a vapor-permeable barrier 9, hygroscopic plates 10 (natural fiber reinforced clay), mineral wool 11, and gypsum board 12. The insulation functions through thermal transmittance.

Surprisingly, the hybrid solar collector of the invention is energetically equivalent despite the shading resulting from PV elements 3'. Measurements have shown that through the shading of the PV elements 3' the heat gain into the interior of the house is in practice only diminished by a U-value of 0.09 W/m²K. The incident solar energy is sufficient to heat the air in gap enough due to the residence time of the air in the air gap, even with overcast skies, for sufficient thermal use within the house interior. The gain of electricity with a standard non bifacial PV element, on the other hand, is rather minor.

Larch and oak, as well as pine and spruce have been shown to be effective as materials for solid wood solar collectors.

Figure 7:
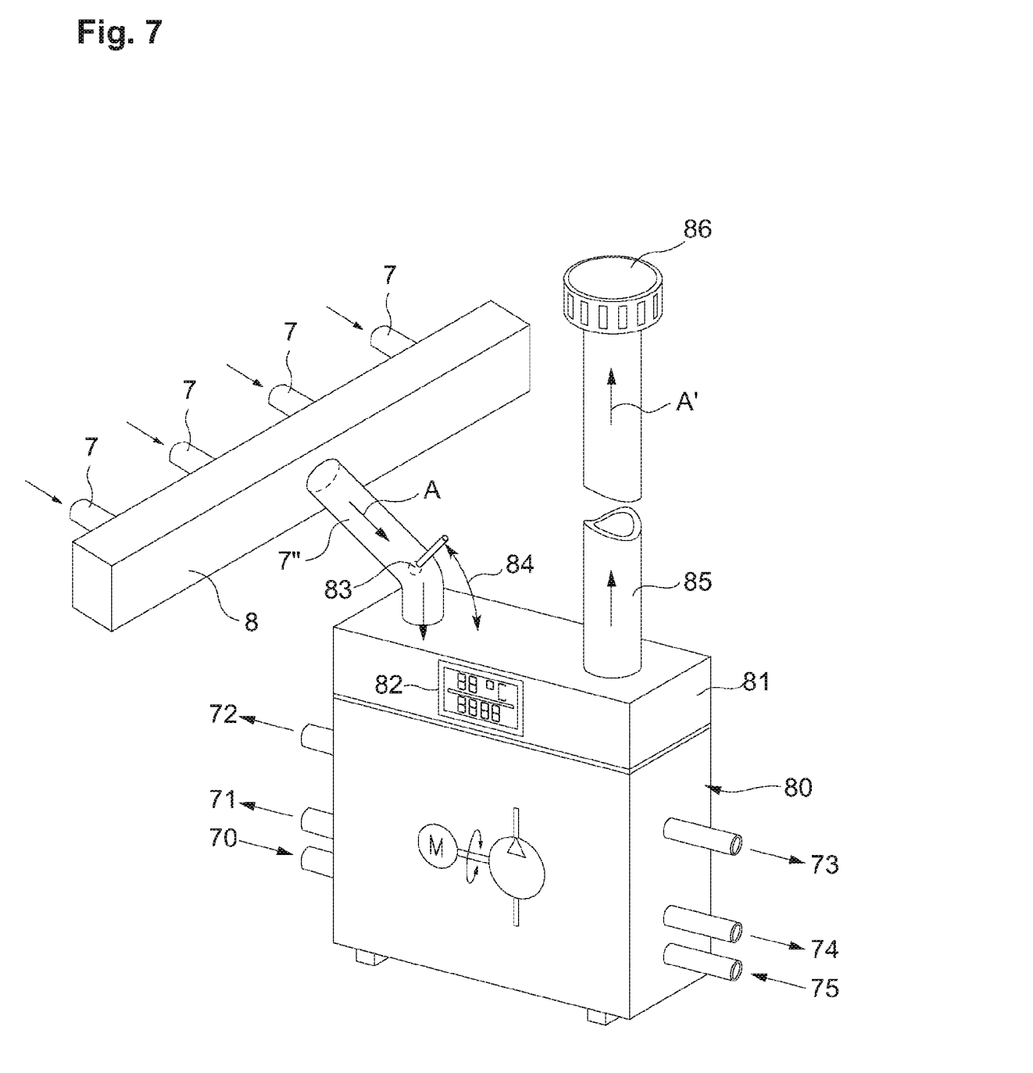
FIG. 7 illustrates the basic hydraulic scheme according to the invention for the recovery and usage of heat collected in air gap, including the air collector duct.

Recovery and utilization of the hot air A is illustrated in the exemplary embodiment shown in FIG. 7.

For an increased yield of electrical energy, high-performance PV elements such as so-called Bifacial Cells (Neo Solar Power Corporation, 30078 Taiwan) are suitable. Especially efficient are third-generation Hetero-Junction Technology PV elements in ("HAST" a corporation by the Meyer Burger Group, Meyer Burger AG, 3645 Gwatt with CSEM SA in 2002 Neuchâtel, Switzerland) used in combination with the Smart Wire Connection Technology "SWCT"; cf. among others Publication Swiss Federal Office of Energy SFOE, 3003 Bern, May 2014. In addition, through the installation and/or application of reflectors on the solar collector such high-performance PV elements can be optimally actuated on both sides.

Due to manufacturing reasons it is recommended to combine cost efficient wood collectors joined together, with high-performance PV elements. For example, profile moldings may be embedded into wood panels and laminated on the front side with metal foils.

Figure 2:
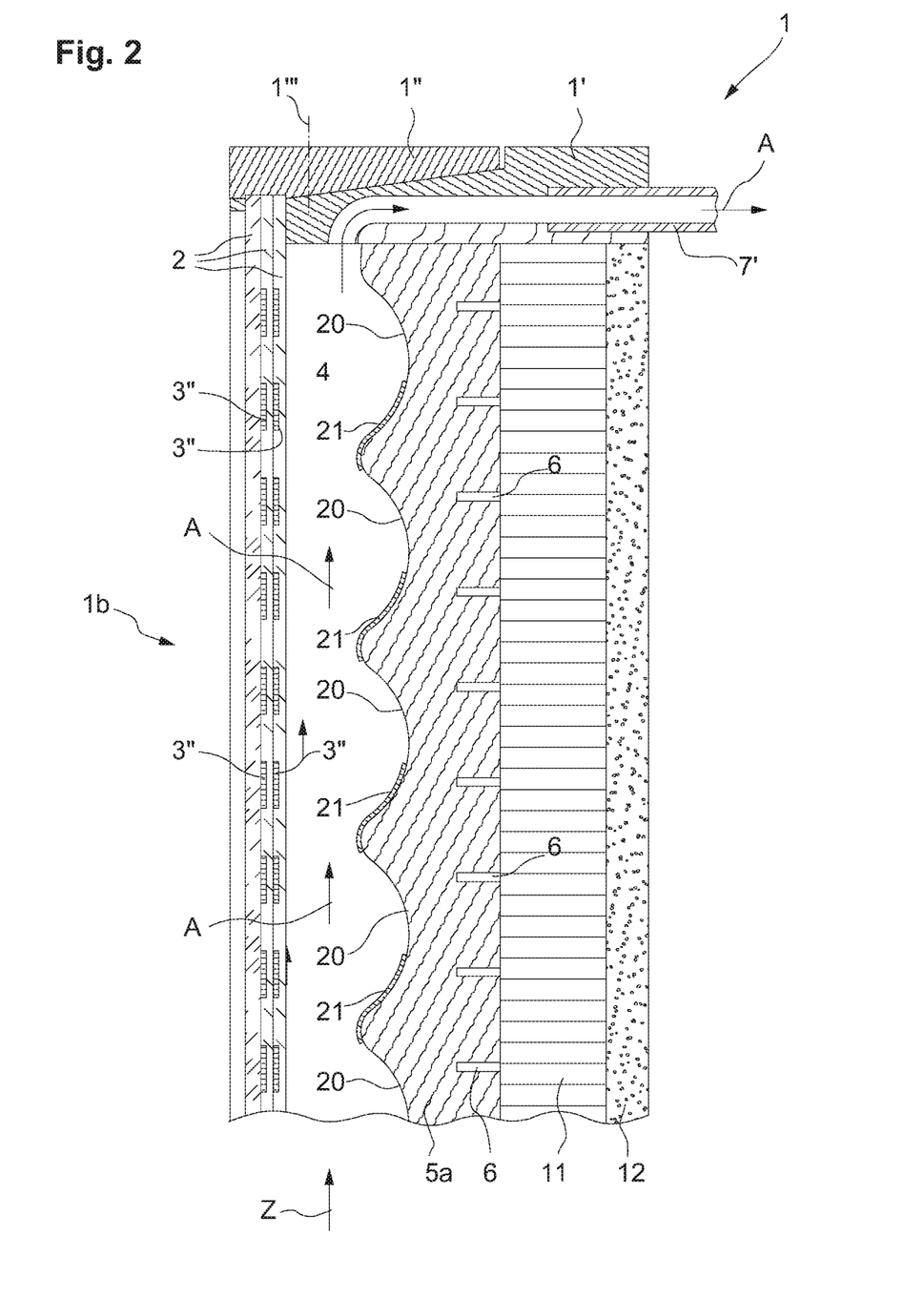
FIG. 2 is a cross-sectional view of another embodiment of a hybrid solar collector according to the invention having an incidence-angle-selective thermal collector made of solid wood with milled out parabolic grooves partially covered with reflective foil.

Even easier to produce are collectors 5 made of wood according to FIG. 2, which have horizontal lengthwise milled out parabolic grooves 20, wherein metallic foil 21 is laminated onto the bottom of the grooves, thus generating, for the most part independent of the position of the sun, a reflection onto the backside (facing away from the sun) of the bi-directional PV elements 3". The remaining scattered radiation is captured in form of heat in the upper area of the milled out grooves 20 and sucked out via the air outlet 7'. Due to the relatively high mass of the depicted collector 5 the insulation was reduced to mineral wool 11 and gypsum board 12.

Figure 3:
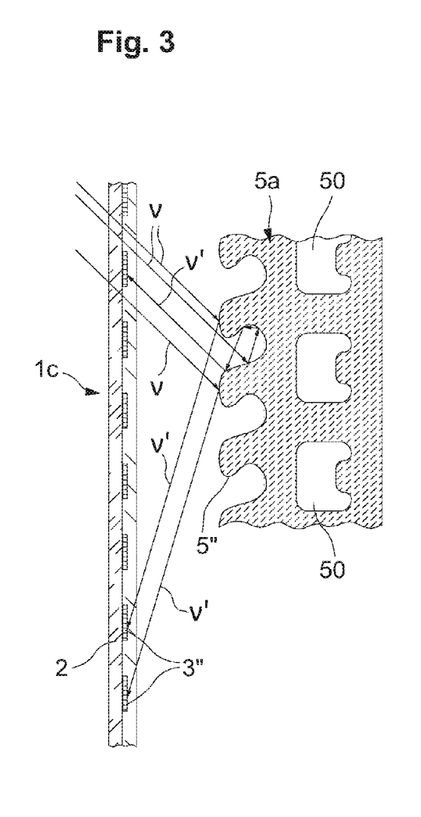
FIG. 3 is a cross-sectional view of another embodiment of a hybrid solar collector according to the invention having a glazed thermal ceramic collector and showing a first angle of incidence (sun position).
Figure 4:
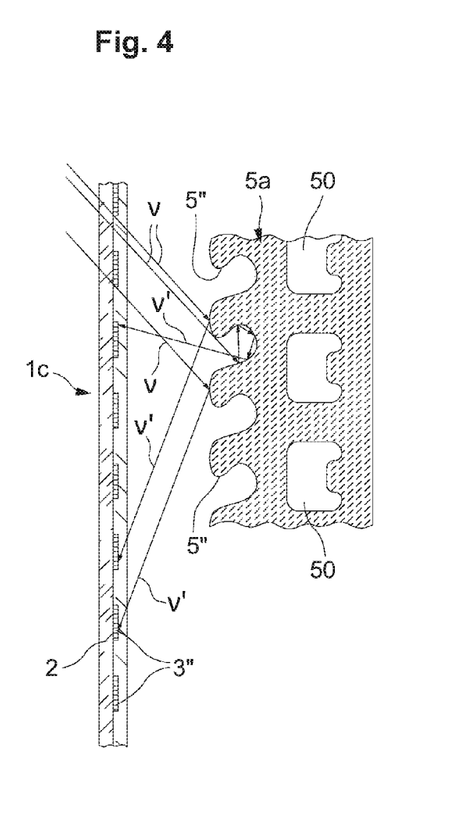
FIG. 4 is a cross-sectional view of the embodiment of FIG. 3 showing a higher angle of incidence (sun position).
Figure 5:
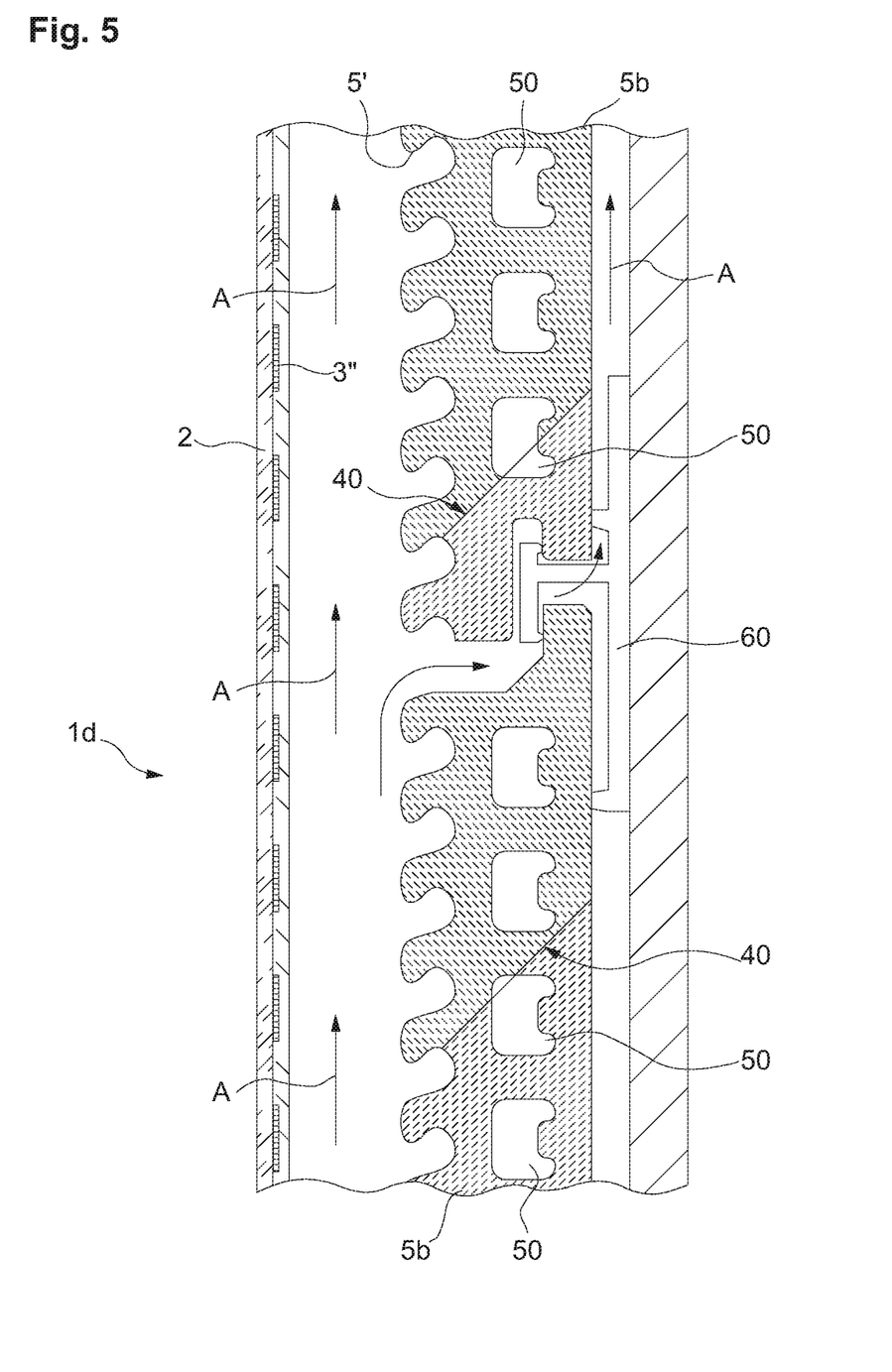
FIG. 5 is a cross-sectional view of another embodiment of a hybrid solar collector according to the invention showing the design and mounting bracket of a rear-vented ceramic thermal collector with indicated air flow.

While hybrid solar collectors 1a with thermal collectors made of wood are somewhat easy to manufacture, others made of ceramic such as 1b to 1e in FIGS. 3 to 5 require a more elaborate manufacturing process.

Ceramic collectors can be produced in a single sheet with optimized reflector noses 5" through an extrusion process (strand casting). On the front side, the collectors 5c (FIG. 6), can be colored, completely or partially glazed, or mirrored. This kind of coating is marked with 21'. Furthermore, their thermal capacity is about twice that of wood. On the other hand, they have relatively low water storage capacity, so that the desired seasonally dependent thermal transmittance observed with wood collectors normally does not set in. Also they are more expensive compared to wood collectors. The reflection paths depicted in FIG. 3 and FIG. 4 of the different incidence angles, where v=incident radiation and v'=reflected radiation, show the good reflective properties the noses 5" possess.

Ceramic collectors 5a, 5b and 5c (FIGS. 3-6) contain hollow spaces 50, thus exhibiting insulation properties similar to that of hollow bricks. This can reduce the need for additional insulation and therefore the overall wall thickness. For clarity reasons the depiction of the bi-directional PV elements is simplified in these drawings.

Through commercially available mounting brackets 60 (Alphaton® horizontal support brackets by Moeding Keramikfassaden GmbH, Marklkofen, Germany) such collectors 5b can through angled surfaces 40 easily be mounted and interlocked together. See FIG. 5.

Figure 6:
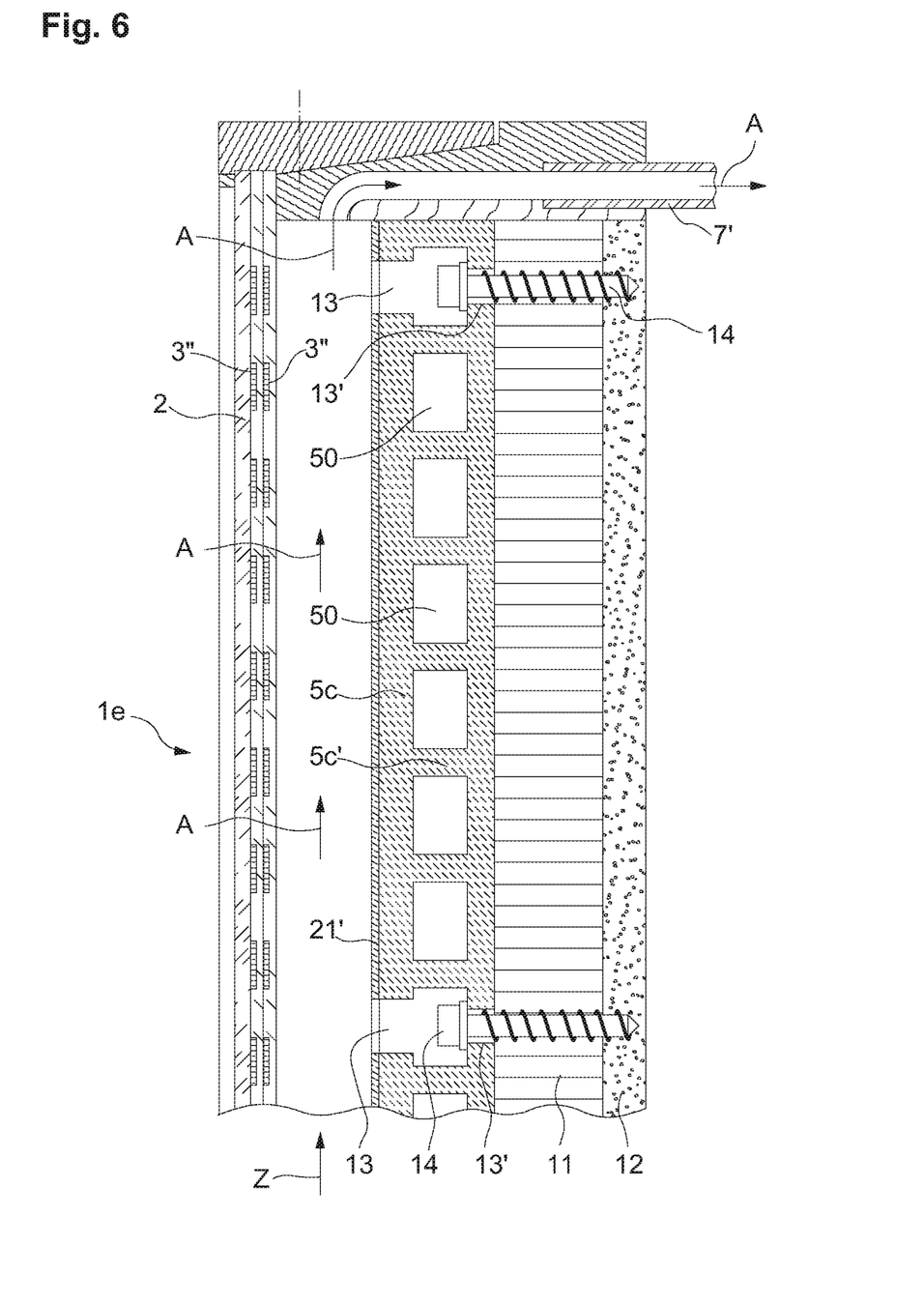

In another embodiment, according to FIG. 6 a flat, glazed ceramic collector 5c may be mounted onto its insulation through bore holes 13 and 13' with appropriate screws 14. The entire front surface of the collector 5c is coated with a reflective glaze 21'.

The incidence-angle-selective effect on the collector 5c in this is case achieved through the arrangement of PV elements with high opacity. The disadvantage of this variant is the low hygroscopicity of the layer structure, so that the desired seasonally dependent thermal transmittance is only minimal. A certain improvement and a rise in temperature of the heat flow A can be achieved by additionally applying spacers in between the collector 5c and the adjacent insulation (in this case rock wool 11 and gypsum board 12), so that a rear ventilation with parallel heat flow can also form.

In each application example only single air outlets 7 and 7' are illustrated. It is understood that the hot air flow A has to be removed through multiple air outlets 7, 7' preferably arranged at equal height, into a collector duct 8, FIG. 7, which is connected through a large exhaust duct 7" to an air-water heat pump 80. The exhaust duct 7" is equipped with a temperature sensor 83, whose signal line 84 and control 81 regulates the speed of the compressor so that the air intake temperature into the heat pump 80 is held steady over small time intervals. The symbolic depiction of the heat pump 80 has a fresh water supply 70 and several service water connections 71 to 73. Additionally, the connections 74 and 75 lead to a heat exchanger, which, through stratified storage tank (solar storage tank), ensures the supply of hot water even during non-solar hours. The cooled air A' from the heat pump 80 is then released to the outdoors through a vertical exhaust pipe 85 with a protective hood 86.

If a surplus of electrical energy is available in the system, it can be used to further heat stored water through an integrated resistance-heating element (post-heated), which would correspond to storing energy during peak solar production.

Instead of regulating the air flow rate via the compressor of the heat pump 80, the incoming air Z can also be regulated in the air gap 4 (FIG. 1 and FIG. 2) to adjust the volume of the hot air flow A. Through an additional fresh air supply a temperature control can be provided that is adjusted to the required air exchange of the house. That way a simple comfort ventilation and heating support system may be constructed.

A control of the supply air Z in the air gap 4 can furthermore be used to force the cooling of the solar collector during the height of the summer, thus increasing the degree of efficiency of the PV elements while reducing the heat transfer into the interior of the house, without the need of energy-intensive air conditioning.

The subject matter of the invention is basically modular allowing also for the retrofitting of existing buildings, especially those already outfitted with incident-angle-selective solar collectors according to WO 99/54669.

KEY TO FIGURES

1 module (top)
1' module frame (wood)
1a hybrid solar collector (execution in wood)
1b-1e hybrid solar collector (execution in ceramic)
2 multilayered cover (glass)
3' PV element (standard)
3" PV element (bidirectional)
4 air gap
4' air exhaust gap
5 collectors made of wood
5b,5c collectors made of ceramic
5c flat collector (ceramic)
5' reflective noses
5" reflective noses mirrored/glazed (ceramic)
5c' web
6 expansion joints/moisture transfer
7,7' air outlet
7" exhaust duct (large) of 8
8 collector duct
9 diffusion open composite layer
10 hygroscopic plates (natural fiber reinforced clay)
11 mineral wool
12 gypsum board (interior room)
13,13' bore holes in 5c

14 Fastening screws with spring washer
20 parabolic milling grooves
21 metallic foil
21' coating/glazing (reflective) on 5c
40 angled surfaces
50 hollow spaces (horizontal)
60 mounting bracket
70 fresh water supply
71-73 service water connection
74-75 connections to heat exchanger (in stratified storage)
80 air-water heat pump
81 control to 80
82 display and control panel (standby mode)
83 temperature sensor
84 signal line to speed regulation of fan (compressor)
85 exhaust pipe
86 protective cover
A hot air flow
A' exhaust air (cold)
Z supply air
v incidence ray (radiation)
v' reflective ray (radiation)

What is claimed is:

1. A hybrid solar collector for regulating indoor climates in buildings comprising a heat storing thermal energy collector having a back solid thermal energy collector portion and a front rear-ventilated cover arranged so that an air gap is formed between the back solid thermal collector portion and the cover, wherein at least one air outlet is connected to the air gap between the back thermal collector portion and the cover,
   said cover comprising photovoltaic elements and being at least partially transparent and/or partially translucent so as to allow solar radiation to impinge on the back solid thermal energy collector portion,
   said back solid thermal collector portion comprising a thermal energy storage element that stores thermal energy and transfers it in a time delayed fashion to the inside of a building, and wherein hot air formed in the air gap is lead away for further use through the at least one air outlet.

2. A hybrid solar collector according to claim 1, wherein the back solid thermal energy collector portion is provided with an exhaust gap and/or exhaust pipe.

3. A hybrid solar collector according to claim 1, wherein the thermal energy storage element is comprised of a heat conducting material.

4. A hybrid solar collector according to claim 1, wherein the thermal energy storage element is comprised of ceramic.

5. A hybrid solar collector according to claim 1, wherein the thermal storage element is comprised of clay.

6. A hybrid solar collector according to claim 1, wherein the thermal energy storage element is comprised of a heat conducting composite.

7. A hybrid solar collector according to claim 4, wherein the thermal energy storage element comprises hollow spaces in its interior.

8. A hybrid solar collector according to claim 1, wherein the heat storing thermal energy collector additionally comprises an insulation portion situated between the thermal energy storage element and the inside of the building.

9. A hybrid solar collector according to claim 1, comprising additional photovoltaic elements arranged facing towards the surface of the back solid thermal energy collector portion wherein the back solid thermal energy collector portion is provided with reflective coatings positioned to allow for reflection of solar radiation off the coatings to reach the photovoltaic elements facing towards the surface of the back solid thermal energy collector portion.

10. A hybrid solar collector according to claim 9 wherein the photovoltaic elements are bifacial.

11. A hybrid solar collector according to claim 9, wherein the back solid thermal energy collector portion comprises frontally arranged reflectors.

12. A hybrid solar collector according to claim 1, wherein the photovoltaic elements are arranged in a horizontal stripe-like pattern with gaps in between the stripes.

13. A hybrid solar collector according to claim 12, wherein the photovoltaic elements are of high opacity and the horizontal stripe-like pattern with gaps in between the stripes provides an incident-angle-selective effect.

14. A hybrid solar collector according to claim 1, wherein the arrangement and/or type of PV elements on the cover provides an incident-angle-selective effect.

15. A hybrid solar collector according to claim 12, wherein the photovoltaic elements are bifacial.

16. A hybrid solar collector according to claim 1, wherein the PV elements are partially transparent and/or partially translucent.

17. A hybrid solar collector according to claim 9, wherein the partial translucency is formed using flat double facing PV elements connected in parallel.

18. A hybrid solar collector according to claim 1, additionally comprising multiple air collectors for collecting hot air from the air gap that feed into a collector duct leading to a centralized location.

19. A hybrid solar collector according to claim 18, additionally comprising openings from which fresh air may be mixed in to the hot air.

20. A hybrid solar collector according to claim 18, wherein the collector duct leads to a variable heat pump provided with a compressor, wherein the compressor controls the volume of the hot air in the air gap so that the temperature in the collector duct is maintained at constant set point.

21. An operating procedure for hybrid solar collector according to claim 1, wherein the hot air in the air gap is led into an upper area having multiple air collectors and then collected through exhaust pipes into a collector duct from which it is lead to a centralized location.

22. An operating procedure for a hybrid solar collector according to claim 21, wherein fresh air is mixed with the hot air.

23. An operating procedure for a hybrid solar collector according to claim 21, wherein the temperature of the hot air is measured and the hot air is led via the collector duct into a variable heat pump provided with a compressor, wherein the compressor controls the volume of the hot air in the air gap so that the temperature in the exhaust duct is set to a constant set point.

24. A hybrid solar collector according to claim 7, wherein the hollow spaces are arranged horizontally.

25. A hybrid solar collector according to claim 4, wherein the thermal storage element is comprised entirely of ceramic.

26. A hybrid solar collector according to claim 5, wherein the thermal storage element is comprised entirely of clay.

27. A hybrid solar collector according to claim 6, wherein the thermal storage element is comprised entirely of a heat conducting composite.

28. A hybrid solar collector according to claim 1, wherein the thermal storage element comprises an incident-angle-selective surface.

* * * * *